US011164819B2

(12) United States Patent
Tseng et al.

(10) Patent No.: US 11,164,819 B2
(45) Date of Patent: Nov. 2, 2021

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Ying-Cheng Tseng, Tainan (TW); Hao-Yi Tsai, Hsinchu (TW); Tin-Hao Kuo, Hsinchu (TW); Chia-Hung Liu, Hsinchu (TW); Chi-Hui Lai, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/425,957

(22) Filed: May 30, 2019

(65) Prior Publication Data

US 2020/0381362 A1 Dec. 3, 2020

(51) Int. Cl.
*H01L 23/538* (2006.01)
*H01L 23/31* (2006.01)
(Continued)

(52) U.S. Cl.
CPC .......... *H01L 23/5384* (2013.01); *H01L 23/31* (2013.01); *H01L 23/49811* (2013.01);
(Continued)

(58) Field of Classification Search
CPC . H01L 23/5384; H01L 23/31; H01L 25/0657; H01L 24/95; H01L 24/14; H01L 24/81; H01L 23/49811; H01L 2224/32245; H01L 2224/73267; H01L 24/19; H01L 2224/04105; H01L 2224/12105; H01L 2224/16235; H01L 2224/81005; H01L 2225/107; H01L 2225/1094; H01L 2225/1035; H01L 25/0655; H01L 25/105; H01L 23/367; H01L 23/5383; H01L 23/5389; H01L 23/5385; H01L 23/3121;
(Continued)

(56) References Cited

U.S. PATENT DOCUMENTS 9,000,584 B2  4/2015  Lin et al.
9,048,222 B2  6/2015  Hung et al.
(Continued)

*Primary Examiner* — Su C Kim
(74) *Attorney, Agent, or Firm* — JCIPRNET

(57) ABSTRACT

A semiconductor package includes a first wafer, a second wafer, and an interconnect. The first wafer includes a first die, a first encapsulating material encapsulating the first die, and a first redistribution structure disposed over the first die and the first encapsulating material. The second wafer includes a second die, a second encapsulating material encapsulating the second die, and a second redistribution structure disposed over the second die and the second encapsulating material, wherein the second redistribution structure faces the first redistribution structure. The interconnect is disposed between the first wafer and the second wafer and electrically connecting the first redistribution structure and the second redistribution structure, wherein the interconnect includes a substrate and a plurality of through vias extending through the substrate for connecting the first redistribution structure and the second redistribution structure.

20 Claims, 6 Drawing Sheets

(51) Int. Cl.
  *H01L 25/065* (2006.01)
  *H01L 23/00* (2006.01)
  *H01L 23/498* (2006.01)

(52) U.S. Cl.
  CPC .............. *H01L 24/14* (2013.01); *H01L 24/81* (2013.01); *H01L 24/95* (2013.01); *H01L 25/0657* (2013.01)

(58) Field of Classification Search
  CPC . H01L 2221/68345; H01L 2221/68359; H01L 21/6835
  See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,905,440 B1* | 2/2018 | Baloglu ................ H01L 21/568 |
| 2013/0221493 A1* | 8/2013 | Kim ...................... H01L 23/481 257/620 |
| 2015/0001685 A1* | 1/2015 | Chung .................. H01L 21/486 257/621 |
| 2016/0141260 A1* | 5/2016 | Chang ................. H01L 21/6836 438/613 |
| 2018/0102313 A1* | 4/2018 | Shih .................... H01L 23/3114 |
| 2019/0088621 A1* | 3/2019 | Yang ....................... H01L 24/11 |

* cited by examiner

SEMICONDUCTOR PACKAGE AND MANUFACTURING METHOD THEREOF

BACKGROUND

With the continued evolution of semiconductor technologies, semiconductor chips/dies are becoming increasingly smaller. In the meantime, more functions are being integrated into the semiconductor dies. Accordingly, the semiconductor dies have increasingly greater numbers of input/output (I/O) pads packed into smaller areas. As a result, the packaging of the semiconductor dies becomes more important and more challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
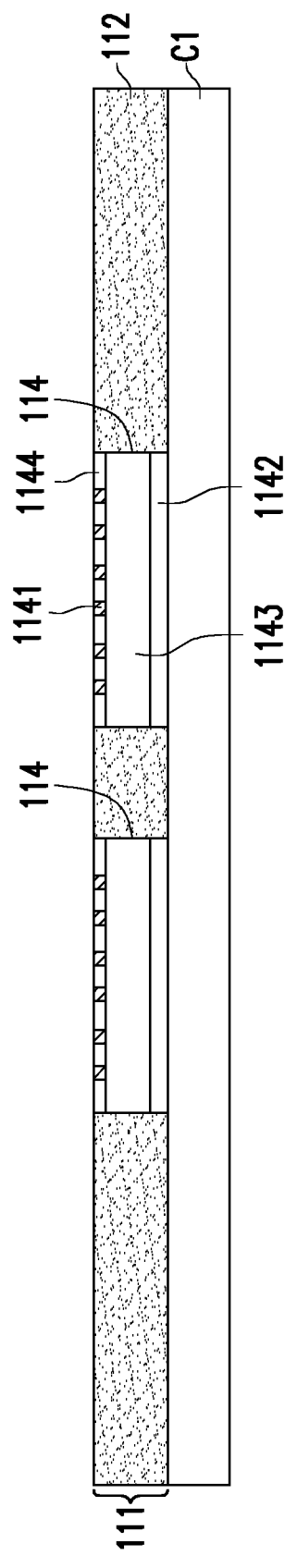
FIG. 1 to FIG. 10 illustrate cross sectional views of intermediate stages in a manufacturing of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

For the embodiments provided herein, the technology may be discussed in a specific context, namely, bonding a first wafer to a second wafer through an interconnect including a substrate and a plurality of through vias extending through the substrate. The first wafer including a first die encapsulated by a first encapsulating material, and the second wafer including a second die encapsulated by a second encapsulating material. Accordingly, by bonding the first wafer and the second wafer through the interconnect, the semiconductor package provides improved integration density with smaller form factors and other advantages, such as allowing for increased performance and lower power consumption, because of the decreased length of interconnects between the dies, as examples.

Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

Figure 8:
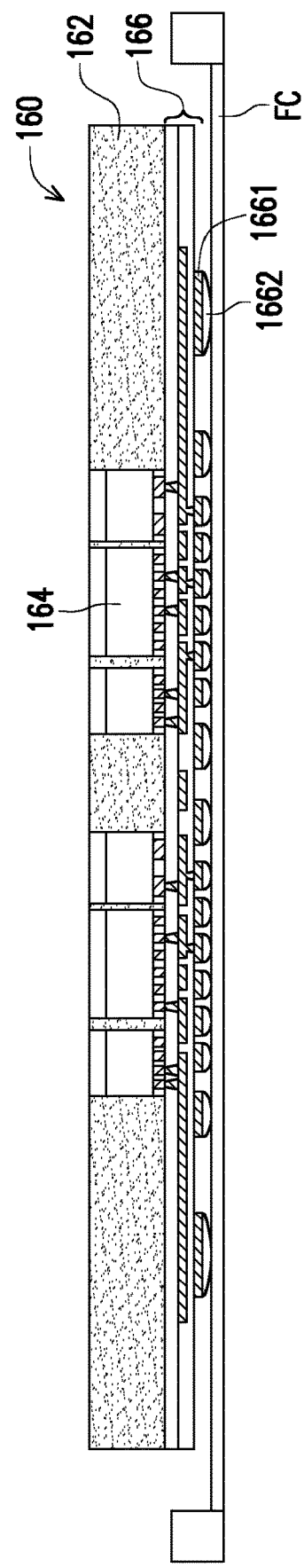
Figure 9:
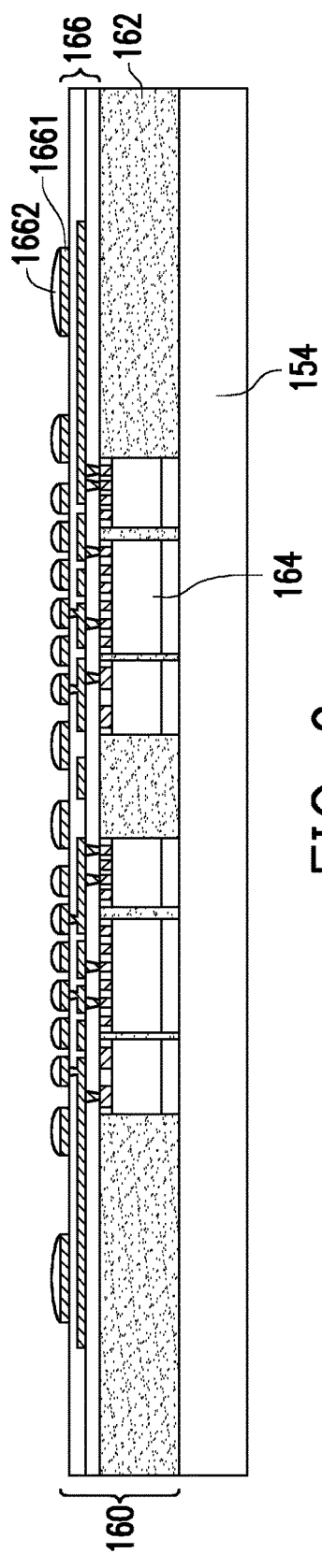
Figure 10:
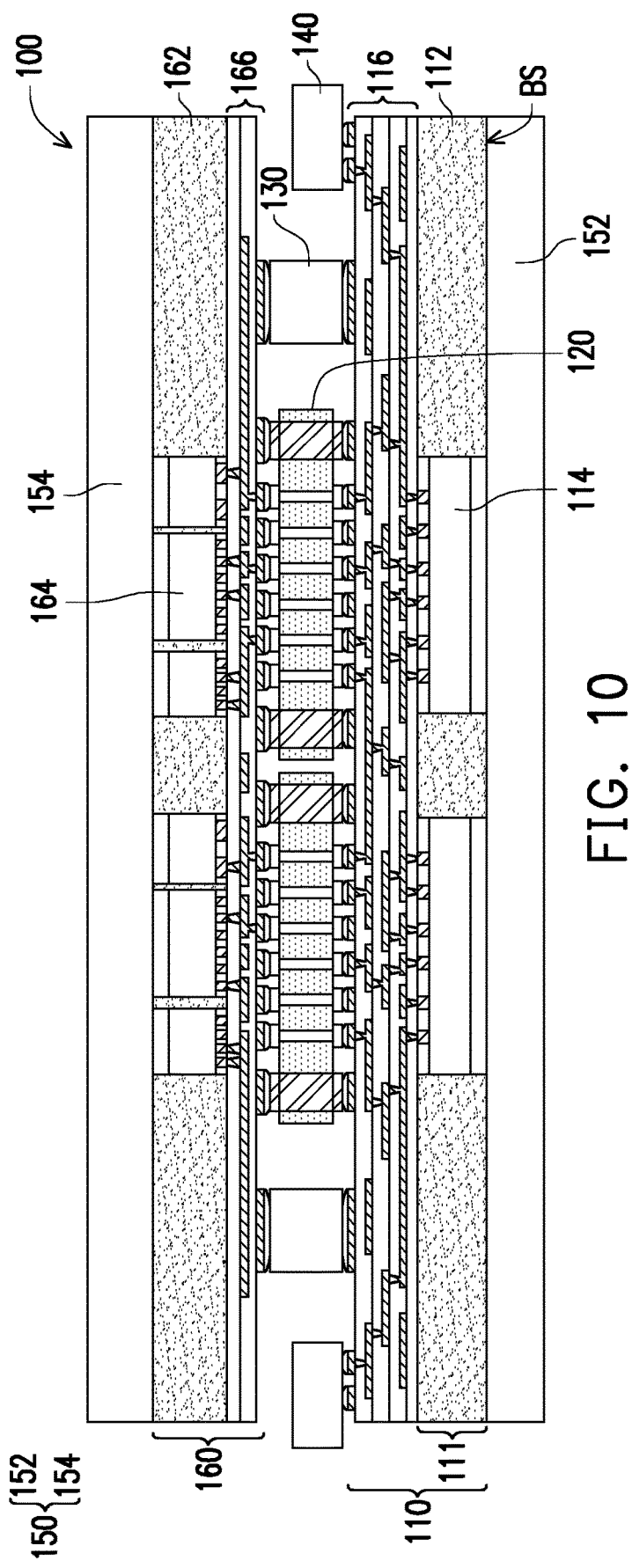
Figure 11:
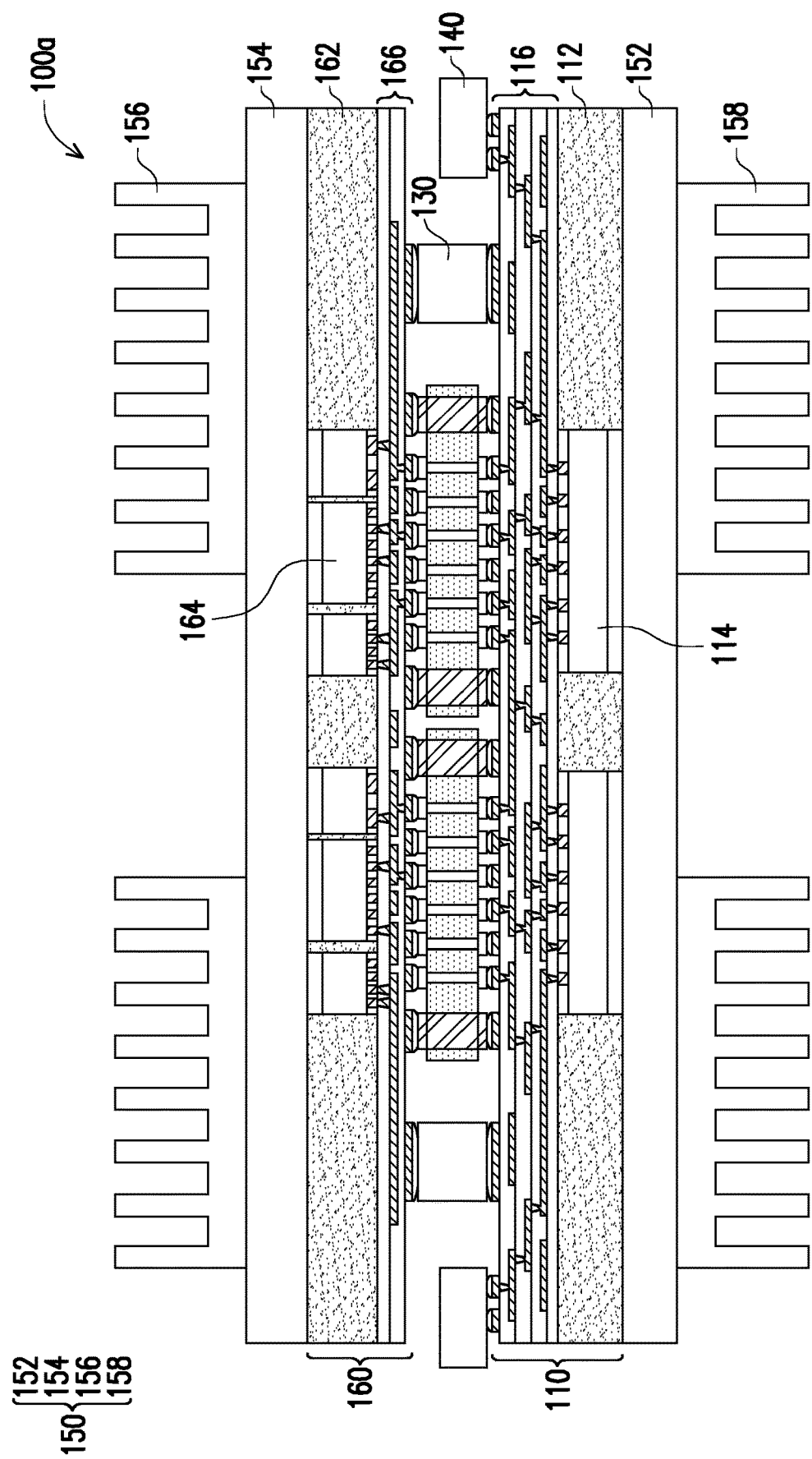
FIG. 11 illustrates a cross sectional view of a semiconductor package according to some exemplary embodiments of the present disclosure.

FIG. 1 to FIG. 10 illustrate cross sectional views of intermediate stages in a manufacturing of a semiconductor package according to some exemplary embodiments of the present disclosure. In some embodiments, the intermediate stages of forming the wafer to wafer bonding structure as shown in FIG. 10 and/or FIG. 11 are described as follows. With now reference to FIG. 1, a first carrier C1 is provided. In some embodiments, an adhesive layer (not shown) may be disposed on the first carrier C1. The first carrier C1 may include glass, ceramic, silicon oxide, aluminum oxide, the like, or a combination thereof. The adhesive layer disposed thereon may be a light to heat conversion release coating (LTHC), or the like.

In addition, at least one first die 114 as shown in FIG. 1 is provided on the first carrier C1. In some embodiments, a plurality of first dies 114 are provided on the first carrier C1, but the disclosure is not limited thereto. In some exemplary embodiments, the first dies 114 may be provided on the first carrier C1 in, for example, a side by side manner. In some embodiments, the first die 114 may include an application specific integrated circuit (ASIC) die, which has an active face with a plurality of conductive vias 1141. Of course, the embodiment herein is merely for illustration, and the disclosure does not limit number and the types of the first dies 114. In some embodiments, the first die 114 is attached to the first carrier C1 through an adhesive layer 1142. In the embodiments wherein the first die 114 includes the substrate 1143, a bottom surface of substrate 1143 may contact the adhesive layer 1142 with the sides of the substrate 1143 and the adhesive layer 1142 being coterminous. In some embodiments, spaces are left between the neighboring first dies 114 wherein there is no adhesive layer in the spaces. In some embodiments, the adhesive layer 1142 may be any suitable adhesive, such as a die attach film (DAF) or the like.

In some exemplary embodiments, the conductive vias 1141 (such as copper vias) may be formed on an active surface (e.g. the top surface) of the first die 114 and electrically coupled to a plurality of the contact pads (not shown) on the substrate 1143 of the first die 114. In some embodiments, a dielectric layer 1144 may be formed on the active surface (e.g. the top surface) of the first die 114, and may cover the top surfaces of the conductive vias 1141. In other embodiments, the top surface of the dielectric layer 1144 may be substantially level with the top surfaces of the conductive vias 1141. Alternatively, the dielectric layer 1144 may be omitted, and the conductive vias 1141 protrude from the active surface of the first die 114.

Then, in accordance with some embodiments of the disclosure, the first dies 114 on the first carrier C1 are encapsulated by a first encapsulating material 112. In other words, the first encapsulating material 112 is formed on the first carrier C1 to encapsulate the first dies 114. In some embodiments, the first encapsulating material 112 fills the gaps between the first dies 114. The first encapsulating material 112 may include a molding compound, an epoxy, or a resin, etc. In some embodiments, a top surface of the first encapsulating material 112 may be higher than the top surface of the dielectric layer 1144. Namely, the encapsulating material 112 covers the top surface of the dielectric layer 1144.

Then, in some embodiments, a thinning process, which may be a grinding process, is performed to thin the first encapsulating material 112 (and the dielectric layer 1144) until the top surfaces of the conductive vias 1141 are revealed. The resulting structure is shown in FIG. 1. Due to the thinning process, the top surface of the first encapsulating material 112 are substantially level with the top surfaces of the conductive vias 1141 and the top surface of the dielectric layer 1144 as shown in FIG. 1. Throughout the description, the resultant structure including the first die 114 and the first encapsulating material 112 as shown in FIG. 1 is referred to as encapsulated first die 111, which may have a wafer form in the process. Accordingly, in the structure of the encapsulated first die 111, the first encapsulating material 112 encapsulates the first die 114.

Figure 2:
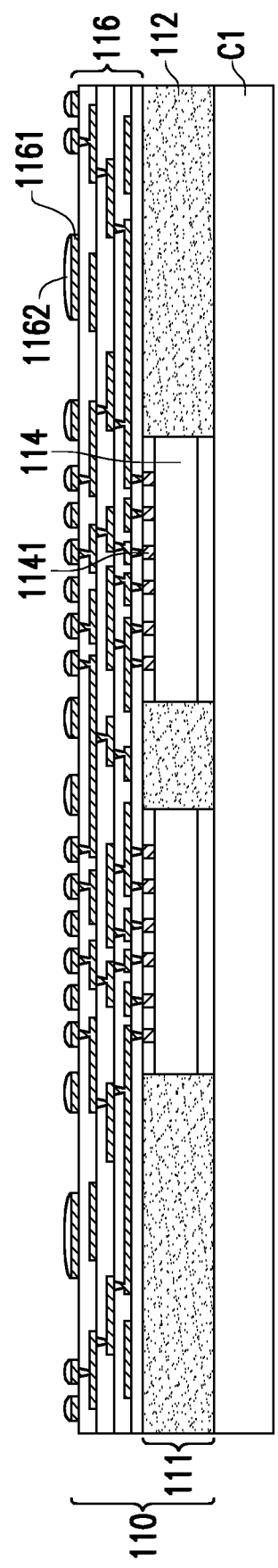

Then, with now reference to FIG. 2, a first redistribution structure 116 is provided over the first die 114 and the top surface of the first encapsulating material 112. The first redistribution structure 116 is electrically connected to the first die 114. In some embodiments, the first redistribution structure 116 are formed over the encapsulated first die 111 to connect to the conductive vias 1141 of the first die 114. In some embodiments, the first redistribution structure 116 may also interconnect the conductive vias 1141. The first redistribution structure 116 may be formed by, for example, depositing conductive layers, patterning the conductive layers to form redistribution circuits, partially covering the redistribution circuits and filling the gaps between the redistribution circuits with dielectric layers, etc. The material of the redistribution circuits may include a metal or a metal alloy including aluminum, copper, tungsten, and/or alloys thereof. The dielectric layers may be formed of dielectric materials such as oxides, nitrides, carbides, carbon nitrides, combinations thereof, and/or multi-layers thereof. The redistribution circuits are formed in the dielectric layers and electrically connected to the first die 114. In addition, an Under Bump Metallurgy (UBM) layer 1161 may be formed on the first redistribution structure 116 by sputtering, evaporation, or electroless plating, etc.

Referring to FIG. 2, at least one of electrical connector 1162 (multiple electrical connectors 1162 are illustrated herein, but not limited thereto) may be disposed on the first redistribution structure 116 in accordance with some exemplary embodiments. The formation of the electrical connectors 1162 may include placing solder balls on the UBM layer 1161 (or on the first redistribution structure 116), and then reflowing the solder balls. In alternative embodiments, the formation of the electrical connectors 1162 may include performing a plating process to form solder regions on the UBM layer 1161 (or on the first redistribution structure 116), and then reflowing the solder regions. In other embodiments, the electrical connectors 1162 may be formed by a metal-paste printing process that is applied to the UBM layer 1161 of the first redistribution structure 116. According to the locations of the UBM layer 1161, a stencil may be employed to print the metal paste on top of the UBM layer 1161 on the first redistribution structure 116. Once a layer of solder has been formed on the UBM layer 1161, a reflow may be performed in order to shape the solder material into the desired bump shape. The electrical connectors 1162 may also include conductive pillars, or conductive pillars with solder caps, which may also be formed through plating. Throughout the description, the resultant structure including the first die 114, the first encapsulating material 112, and the first redistribution structure 116 as shown in FIG. 2 is referred to as first wafer 110, which may have a wafer form in the process. Accordingly, in the structure of the first wafer 110, the first encapsulating material 112 encapsulates the first die 114, and the first redistribution structure 116 disposed over the first die 114 and the first encapsulating material 112.

Figure 3:
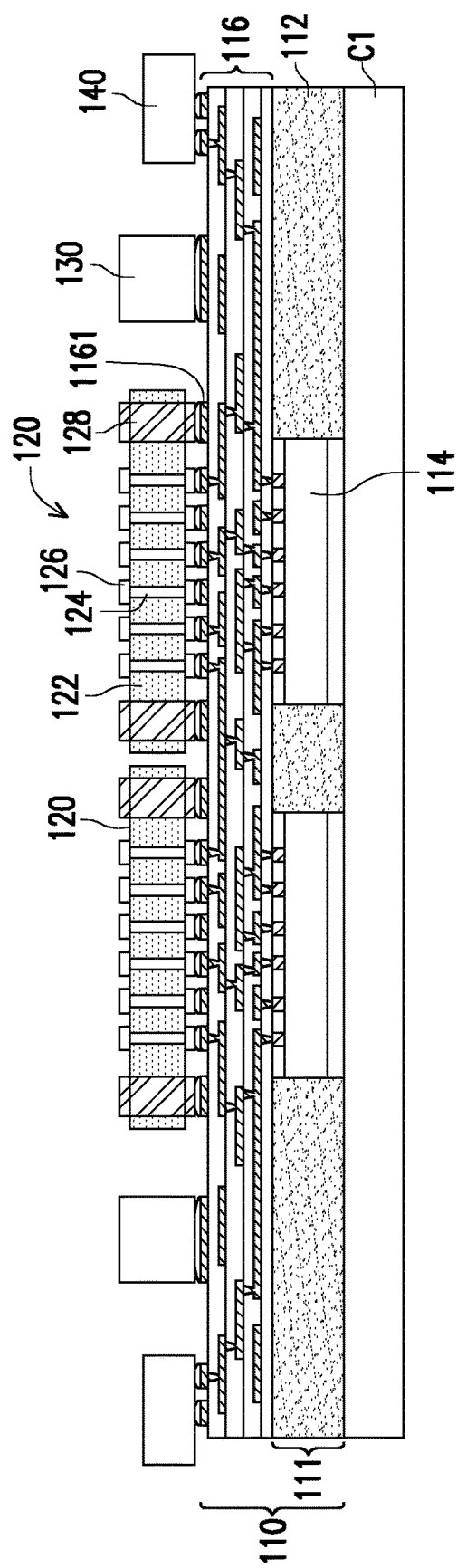

With now reference to FIG. 3, in some embodiments, at least one interconnect 120 (two interconnects 120 are illustrated herein, but not limited thereto) is provided on the first redistribution structure 116 and electrically connected to the first redistribution structure 116. In some embodiments, the interconnect 120 may be a dual sided connector, an interposer, or the like. In some embodiments, the interconnect 120 may include a plurality of through vias 124 extending through a substrate 122 and a plurality of external connectors 126 formed on the opposite sides of the substrate 122. In some exemplary embodiments, the substrate 122 may be formed of a semiconductor material, such as silicon, silicon germanium, silicon carbide, gallium arsenide, or other commonly used semiconductor materials. Alternatively, the substrate 122 is formed of a dielectric material such as silicon oxide.

In accordance with some embodiments of the disclosure, the first redistribution structure 116 and interconnects 120 are connected to one another through electrical connectors 1162. The external connectors 126 such as contact pads or redistribution circuits are formed over the substrate 122, and electrically coupled to the through vias 124. The external connectors 126 may include metal lines for routing electrical signal and metal pads. In an embodiment, the external connectors 126 are formed of copper, although they can also be formed of other metals such as aluminum, silver, titanium, tantalum, tungsten, nickel, and/or alloys thereof.

In some exemplary embodiments, the interconnect 120 may further includes a plurality of dummy vias 128 extending through the substrate 122, and electrically insulated from the through vias 124. In some embodiments, the dummy vias 128 are configured to provide support and alignment to the structure to be mounted on the interconnect 120. The dummy vias 128 may be formed of dummy metal in some exemplary embodiments and may also provide heat dissipation function to the semiconductor package.

In accordance with some embodiments of the disclosure, a plurality of bracing members 130 may be disposed on the first redistribution structure 116. In some embodiments, the bracing members 130 are configured to provide support to the structure to be mounted on the interconnect 120. In some embodiments, the bracing members 130 may be a plurality of dummy metal pillars such as copper pillars or the like. In the embodiment, the bracing members 130 may also provide heat dissipation function to the semiconductor package. In other embodiments, the bracing members 130 may be pillars formed of insulating material.

In accordance with some embodiments of the disclosure, in the embodiments of the first die 114 being an ASIC, a connector 140 may further be disposed on the first redistribution structure 116 and electrically connected to the first redistribution structure 116 and the first die 114. The connector 140 is configured to electrically connect the first die 114 to an external component, such that the first die 114 is able to, for example, monitor an electrical activity of the external component. In some exemplary embodiments, the bracing member 130 may be disposed in the space between the interconnect 120 and the connector 140 to avoid stress concentration on the structure to be mounted on the interconnect 120.

Figure 4:
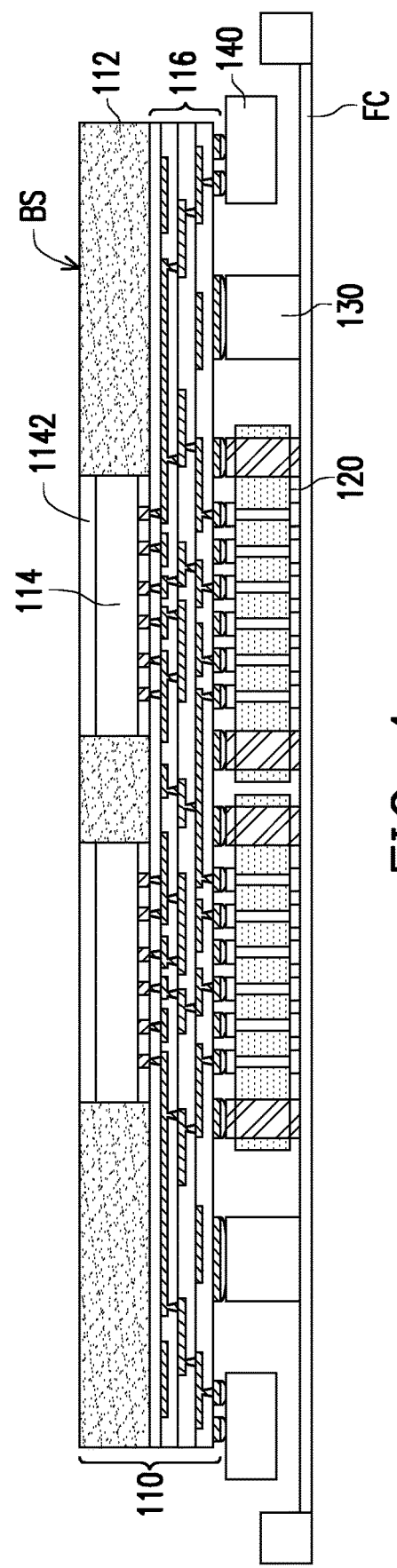

With now reference to FIG. 4, the resultant structure (the first wafer 110 with the interconnects 120, the bracing member 130, the connector 140, etc., disposed thereon) shown in FIG. 3 is then flipped over to be disposed on a frame carrier FC. In some embodiments, the frame carrier FC may include a frame disposed on an adhesive tape. In some embodiments, the resultant structure shown in FIG. 3 is disposed on the frame carrier FC with the interconnects 120 facing the frame carrier FC. Then, the first carrier C1 can be removed to reveal a back surface BS of the first wafer 110. The frame carrier FC is configured to provide support and ease of handling during the removal of the first carrier C1.

In some embodiments, the first carrier C1 is detached from the back surface BS of the first wafer 110 by causing the adhesive layer on the first carrier C1 to lose or reduce adhesion. The adhesive layer is then removed along with the first carrier C1. For example, the adhesive layer may be exposed to UV light, so that the adhesive layer loses or reduces adhesion, and hence the first carrier C1 and the adhesive layer can be removed from the first wafer 110. Then, a grinding process may be optionally performed to lightly grind the back surface BS of the first wafer 110. Alternatively, the grinding process may be skipped.

Figure 5:
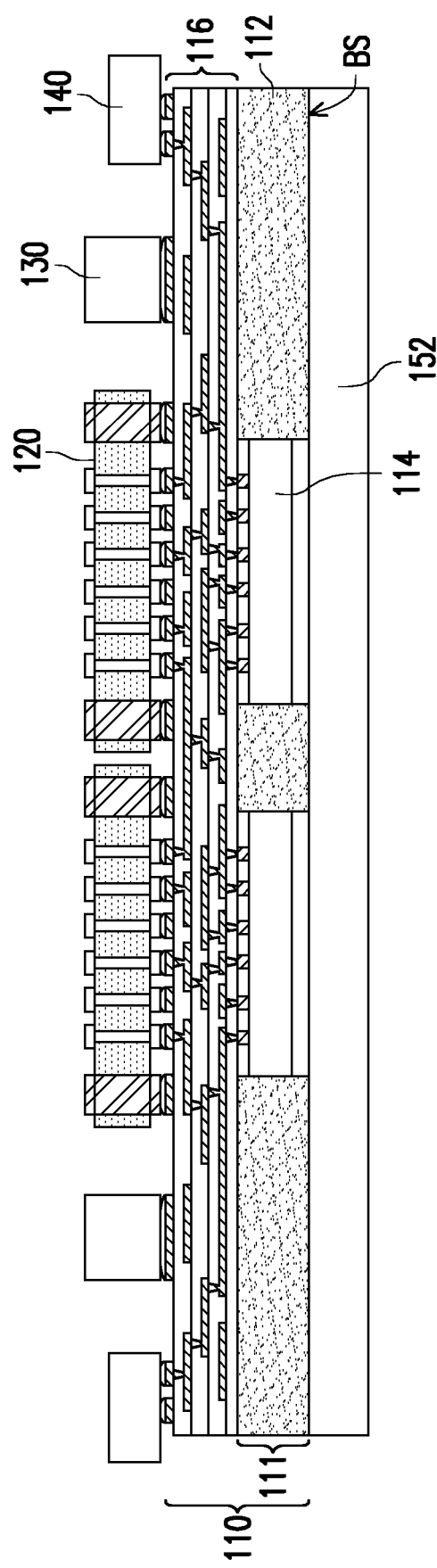

With now reference to FIG. 5, a heat dissipation member 152 may be disposed on the back surface BS of the first wafer 110. In some embodiments, the heat dissipation member 152 may be a cold plate, or the like, to facilitate heat dissipation of the first die 114. In general, the cold plate is a type of liquid cooling wherein a liquid is pumped through a closed loop cooling system and removes heat from the first die 114 or from heat exchangers that are in thermal contact with the first die 114. In other embodiments, the heat dissipation member may be a heat sink or other suitable heat dissipation means. The disclosure is not limited thereto. Then, the frame carrier FC may be removed.

Figure 6:
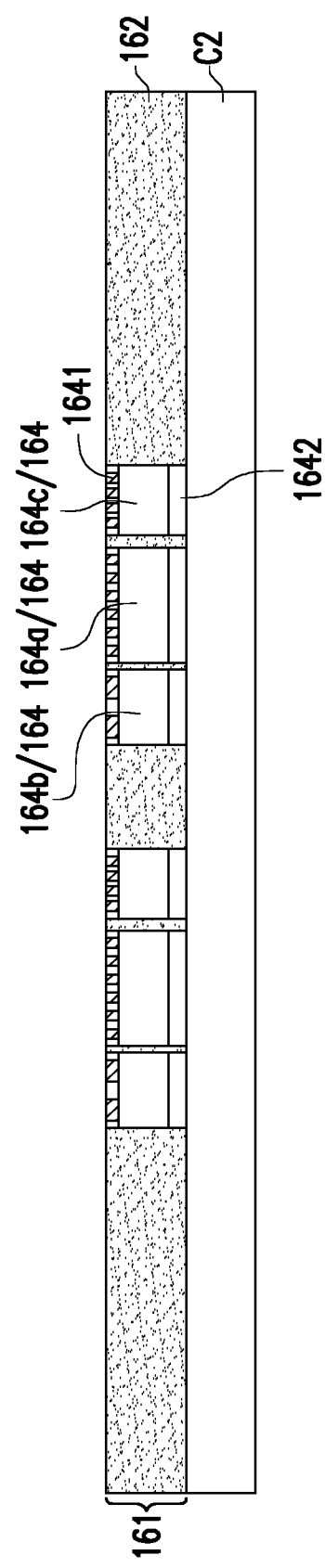
Figure 7:
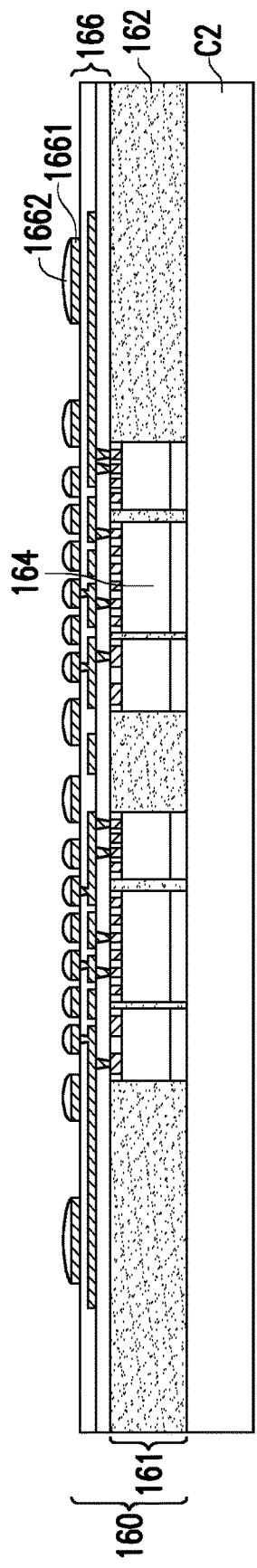

With now reference to FIG. 6 and FIG. 7, a manufacturing process similar to the process described with regarding to FIG. 1 and FIG. 2 is adopted to form a second wafer 160 shown in FIG. 7. For purpose of clarity and simplicity, detail description of same or similar features may be omitted, and the same or similar reference numbers denote the same or like components. The manufacturing process for forming the second wafer 160 are described as follows.

In some embodiments, at least one second die 164 as shown in FIG. 6 is provided on the second carrier C2. In some embodiments, an adhesive layer (not shown) may be disposed on the second carrier C2. The second carrier C2 may include glass, ceramic, silicon oxide, aluminum oxide, the like, or a combination thereof. The adhesive layer disposed thereon may be a light to heat conversion release coating (LTHC), or the like.

In accordance with some embodiments of the disclosure, a plurality of second dies 164 are provided on the second carrier C2, but the disclosure is not limited thereto. In some exemplary embodiments, the second dies 164 may be provided on the second carrier C2 in, for example, a side by side manner. In some embodiments, the second die 164 may include a power semiconductor die configured for supplying power to the first dies 114. In some embodiments, the second dies 164 may include, for example, a power metal-oxide-semiconductor field-effect Transistor (power MOSFET) die 164a and a pulse width modulation (PWM) die 164b. In some embodiments, an inductor 164c may also be disposed on the second carrier C2 along with the power MOSFET 164a and the PWM die 164b. Of course, the embodiment herein is merely for illustration, and the disclosure does not limit number, arrangement and the types of the second dies 164. In other embodiments, the first dies 114 and the second dies 164 may all be ASIC dies. In some embodiments, the second dies 164 are attached to the second carrier C2 through an adhesive layer 1642. In some embodiments, the adhesive layer 1642 may be any suitable adhesive, such as a die attach film (DAF) or the like.

Then, in accordance with some embodiments of the disclosure, the second dies 164 on the second carrier C2 are encapsulated by a second encapsulating material 162. In other words, the second encapsulating material 162 is formed on the second carrier C2 to encapsulate the second dies 164. In some embodiments, the second encapsulating material 162 fills the gaps between the second dies 164. The second encapsulating material 112 may include a molding compound, an epoxy, or a resin, etc. In some embodiments, a top surface of the second encapsulating material 112 may cover the top surface of the second dies 164.

Then, in some embodiments, a thinning process, which may be a grinding process, is performed to thin the second encapsulating material 162 until the conductive vias of the second dies 164 are revealed. The resulting structure is shown in FIG. 6. Due to the thinning process, the top surface of the second encapsulating material 162 are substantially level with the top surfaces of the second dies 164 as shown in FIG. 6. Throughout the description, the resultant structure including the second die 164 and the second encapsulating material 162 as shown in FIG. 6 is referred to as encapsulated second die 161, which may have a wafer form in the process. Accordingly, in the structure of the encapsulated second die 161, the second encapsulating material 162 encapsulates the second die 164.

Then, with now reference to FIG. 2, a second redistribution structure 166 is provided over the encapsulated second die 161. In detail, the second redistribution structure 166 is provided over the second die 164 and the top surface of the second encapsulating material 162. The second redistribution structure 166 is electrically connected to the second die 164. In some embodiments, the second redistribution structure 166 may be formed by, for example, depositing conductive layers, patterning the conductive layers to form redistribution circuits, partially covering the redistribution circuits and filling the gaps between the redistribution circuits with dielectric layers, etc. The material of the redistribution circuits may include a metal or a metal alloy including aluminum, copper, tungsten, and/or alloys thereof. The dielectric layers may be formed of dielectric materials such as oxides, nitrides, carbides, carbon nitrides, combinations thereof, and/or multi-layers thereof. The redistribution circuits are formed in the dielectric layers and electrically connected to the second die 164. In addition, an Under Bump Metallurgy (UBM) layer 1661 may be formed on the second redistribution structure 166 by sputtering, evaporation, or electroless plating, etc.

Referring to FIG. 7, at least one of electrical connector 1662 (multiple electrical connectors 1662 are illustrated herein, but not limited thereto) may be disposed on the second redistribution structure 166 in accordance with some exemplary embodiments. The formation of the electrical connectors 1662 may include placing solder balls on the UBM layer 1661 (or on the second redistribution structure 166), and then reflowing the solder balls. In alternative embodiments, the formation of the electrical connectors 1662 may include performing a plating process to form solder regions on the UBM layer 1661 (or on the second redistribution structure 166), and then reflowing the solder regions. In other embodiments, the electrical connectors 1662 may be formed by a metal-paste printing process that is applied to the UBM layer 1661 of the second redistribution structure 166. According to the locations of the UBM layer 1661, a stencil may be employed to print the metal paste on top of the UBM layer 1661 on the second redistribution structure 166. Once a layer of solder has been formed on the UBM layer 1661, a reflow may be performed in order to shape the solder material into the desired bump shape. The electrical connectors 1662 may also include conductive pillars, or conductive pillars with solder caps, which may also be formed through plating. Throughout the description, the resultant structure including the second die 164, the second encapsulating material 162, and the second redistribution structure 166 as shown in FIG. 7 is referred to as second wafer 160, which may have a wafer form in the process. Accordingly, in the structure of the second wafer 160, the second encapsulating material 162 encapsulates the second die 164, and the second redistribution structure 166 disposed over the second die 164 and the second encapsulating material 162.

With now reference to FIG. 8, the second wafer 160 along with the second carrier C2 is then flipped over to be disposed on a frame carrier FC. In some embodiments, the frame carrier FC may be the same as or similar to the frame carrier FC shown in FIG. 4, which includes a frame disposed on an adhesive tape. In some embodiments, the second wafer 160 is disposed on the frame carrier FC with the second redistribution structure 166 (or the electrical connectors 1662) facing the frame carrier FC. Then, the second carrier C2 can be removed to reveal the back surface of the second wafer 160. The frame carrier FC is configured to provide support and ease of handling during the removal of the second carrier C2.

In some embodiments, the second carrier C2 is detached from the back surface of the second wafer 160 by causing the adhesive layer on the second carrier C2 to lose or reduce adhesion. The adhesive layer is then removed along with the second carrier C2. For example, the adhesive layer may be exposed to UV light, so that the adhesive layer loses or reduces adhesion, and hence the second carrier C2 and the adhesive layer can be removed from the second wafer 160. Then, a grinding process may be optionally performed to lightly grind the back surface of the second wafer 160. Alternatively, the grinding process may be skipped.

With now reference to FIG. 9, a heat dissipation member 154 may be disposed on the back surface of the second wafer 160. In some embodiments, the heat dissipation member 154 may be a cold plate, or the like, to facilitate heat dissipation of the second die 164. In other embodiments, the heat dissipation member may be a heat sink or other suitable heat dissipation means. The disclosure is not limited thereto. Then, the frame carrier FC may be removed.

With now reference to FIG. 10, the resultant structure (including the second wafer 160 and the heat dissipation member 154) shown in FIG. 9 is boned to the resultant structure (including the first wafer 110, the interconnect 120, the bracing members 130, the connectors 140 and the heat dissipation member 154) shown in FIG. 5 through the interconnect 120. In some embodiments, the resultant structure shown in FIG. 9 may be flipped over and then mounted on the resultant structure shown in FIG. 5 via the external connectors 126 of the interconnects 120 and the contacts of the bracing member 130. In some embodiments, a reflow process is applied to the semiconductor package 100 so that the solder material on the second redistribution structure 166 may coalesce into the external connectors 126 of the interconnects 120 and the contacts of the bracing member 130, such that the second wafer 160 is physically and electrically coupled to the first wafer 110.

Accordingly, the second wafer 160 is bonded to the first wafer 110 through the interconnects 120 in a manner of the second redistribution structure 166 facing the first redistribution structure 116. The interconnects 120 is disposed between the first wafer 110 and the second wafer 160. The first redistribution structure 116 and the second redistribution structure 166 are electrically connected to each other through the through vias 124 of the interconnects. In some embodiments, the dummy vias 128 of the interconnects 120 are configured to connect the first redistribution structure 116 and the second redistribution structure 166 and electrically insulated from the plurality of through vias 124 to provide support and alignment to the second wafer 160. In some exemplary embodiments, the bracing member 130 disposed between the first wafer and the second wafer and located in the space between the interconnect 120 and the connector 140 to provide support and avoid stress concentration on the second wafer 160.

With such arrangement, the first die 114 and the second die 164 are electrically connected to each other through wafer to wafer bonding techniques instead of both mounting on a substrate such as a printed circuit board. Therefore, the package substrate can be omitted and the size of the semiconductor package can be reduced due to wafer stacking configuration. Moreover, in the embodiments of the first die 114 being an ASIC die 114 and the second die 164 being a power semiconductor die 164, the ASIC die 114 and the power semiconductor die 164 are connected via wafer to wafer bonding techniques. As a result, a length of a power connection path from the power semiconductor die 164 to the ASIC die 114 is minimized, which results in one or more effects including, but not limited to, low power delivery network (PDN) impedance, small voltage variation, and low power consumption.

FIG. 11 illustrates a cross sectional view of a semiconductor package according to some exemplary embodiments of the present disclosure. It is noted that the semiconductor package 100a shown in FIG. 11 contains many features same as or similar to the semiconductor package 100 disclosed earlier with FIG. 10. For purpose of clarity and simplicity, detail description of same or similar features may be omitted, and the same or similar reference numbers denote the same or like components. The main differences between the semiconductor package 100a shown in FIG. 11 and the semiconductor package 100 disclosed earlier with FIG. 10 are described as follows.

With now reference to FIG. 11, in some embodiments, an auxiliary heat dissipation member 156 may be further disposed on the heat dissipation member 154, and an auxiliary heat dissipation member 158 may be further disposed on the heat dissipation member 152, so as to further improve the heat dissipation efficiency of the semiconductor package 100a. In some embodiments, the heat dissipation members 152, 154 may be cold plates, while the auxiliary heat dissipation members 156, 158 may be heat sinks with heat dissipation fins, but the disclosure is not limited thereto. The disclosure does not limit the numbers and types of the heat dissipation members applied onto the semiconductor package.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a first wafer, a second wafer, and an interconnect. The first wafer includes a first die, a first encapsulating material encapsulating the first die, and a first redistribution structure disposed over the first die and the first encapsulating material. The second wafer includes a second die, a second encapsulating material encapsulating the second die, and a second redistribution structure disposed over the second die and the second encapsulating material, wherein the second redistribution structure faces the first redistribution structure. The interconnect is disposed between the first wafer and the second wafer and electrically connecting the first redistribution structure and the second redistribution structure, wherein the interconnect includes a substrate and a plurality of through vias extending through the substrate for connecting the first redistribution structure and the second redistribution structure.

In accordance with some embodiments of the disclosure, a semiconductor package includes a first wafer, a second wafer and an interconnect. The first wafer includes a first die, a first encapsulating material encapsulating the first die, and a first redistribution structure disposed over the first die and the first encapsulating material. The second wafer includes a power semiconductor die, a second encapsulating material encapsulating the power semiconductor die, and a second redistribution structure disposed over the power semiconductor die and the second encapsulating material, wherein the second redistribution structure faces the first redistribution structure. The interconnect is disposed between the first wafer and the second wafer and electrically connecting the first redistribution structure and the second redistribution structure.

In accordance with some embodiments of the disclosure, a manufacturing method of a semiconductor package includes the following steps. An encapsulated first die is provided on a first carrier. A first redistribution structure is provided on the encapsulated first die to form a first wafer. An interconnect is provided on the first redistribution structure. The first carrier is removed. An encapsulated second die is provided on a second carrier. A second redistribution structure is provided on the encapsulated second die to form a second wafer. The second carrier is removed. The second wafer is bonded to the first wafer through the interconnect.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first package structure comprising a first die, a first encapsulating material encapsulating the first die, and a first redistribution structure disposed over the first die and the first encapsulating material;
   a second package structure comprising a second die, a second encapsulating material encapsulating the second die, and a second redistribution structure disposed over the second die and the second encapsulating material, wherein the second redistribution structure faces the first redistribution structure;
   an interconnect disposed between the first package structure and the second package structure and electrically connecting the first redistribution structure and the second redistribution structure, wherein the interconnect comprises a substrate and a plurality of through vias extending through the substrate for connecting the first redistribution structure and the second redistribution structure, and a lateral dimension of the interconnect is smaller than those of the first package structure and the second package structure; and
   a plurality of bracing members extending from the first package structure to the second package structure, wherein the plurality of bracing members are in contact with the first redistribution structure and the second redistribution structure, wherein the plurality of bracing members is electrically insulated from the first package structure and the second package structure.

2. The semiconductor package as claimed in claim 1, wherein one of the first die and the second die is a power semiconductor die.

3. The semiconductor package as claimed in claim 1, wherein one of the first die and the second die is an application-specific integrated circuit (ASIC) die.

4. The semiconductor package as claimed in claim 1, wherein the interconnect further comprises a plurality of dummy vias connecting the first redistribution structure and the second redistribution structure and electrically insulated from the plurality of through vias.

5. The semiconductor package as claimed in claim 1, wherein the plurality of bracing members is laterally spaced apart from the interconnect.

6. The semiconductor package as claimed in claim 1, wherein the plurality of bracing members comprises a plurality of dummy metal pillars.

7. The semiconductor package as claimed in claim 1, further comprising a connector disposed on the first redistribution structure and electrically connected to the first die, wherein the first die comprises an ASIC die.

8. The semiconductor package as claimed in claim 1, further comprising a heat dissipation member disposed on the first package structure and/or the second package structure.

9. A semiconductor package, comprising:
a first package structure comprising a first die, a first encapsulating material encapsulating the first die, and a first redistribution structure disposed over the first die and the first encapsulating material;
a second package structure comprising a power semiconductor die, a second encapsulating material encapsulating the power semiconductor die, and a second redistribution structure disposed over the power semiconductor die and the second encapsulating material, wherein the second redistribution structure faces the first redistribution structure;
an interconnect disposed between the first package structure and the second package structure and electrically connecting the first redistribution structure and the second redistribution structure, wherein a lateral dimension of the interconnect is smaller than those of the first package structure and the second package structure, a recess portion is defined by and disposed between the first package structure and the second package structure, and the interconnect is surrounded by the recess portion; and
a plurality of dummy pillars disposed within the recess portion and extending from the first redistribution structure to the second redistribution structure for supporting the first package structure and the second package structure, wherein the plurality of dummy pillars are laterally and completely spaced apart from the interconnect via the recess portion existed therebetween.

10. The semiconductor package as claimed in claim 9, wherein the first die comprises an application-specific integrated circuit (ASIC) die.

11. The semiconductor package as claimed in claim 10, further comprising a connector disposed on the first redistribution structure and electrically connected to the first die.

12. The semiconductor package as claimed in claim 9, wherein the interconnect comprises a substrate and a plurality of through vias extending through the substrate for connecting the first redistribution structure and the second redistribution structure.

13. The semiconductor package as claimed in claim 12, wherein the interconnect further comprises a plurality of dummy vias connecting the first redistribution structure and the second redistribution structure and electrically insulated from the plurality of through vias.

14. The semiconductor package as claimed in claim 9, wherein the plurality of dummy pillars are in contact with the first redistribution structure and the second redistribution structure.

15. The semiconductor package as claimed in claim 9, further comprising a heat dissipation member disposed on the first package structure and/or the second package structure.

16. A manufacturing method of a semiconductor package, comprising:
providing an encapsulated first die on a first carrier;
providing a first redistribution structure on the encapsulated first die to form a first wafer;
providing an interconnect on the first redistribution structure;
disposing the first wafer with the interconnect on a first frame carrier, wherein the interconnect facing the first frame carrier;
removing the first carrier after disposing the first wafer with the interconnect on the first frame carrier;
removing the first frame carrier;
providing an encapsulated second die on a second carrier;
providing a second redistribution structure on the encapsulated second die to form a second wafer;
removing the second carrier; and
bonding the second wafer to the first wafer through the interconnect.

17. The manufacturing method of the semiconductor package as claimed in claim 16, further comprising:
providing a plurality of bracing members on the first redistribution structure before the second wafer is bonded to the first wafer through the interconnect.

18. The manufacturing method of the semiconductor package as claimed in claim 16, further comprising:
providing a connector on the first redistribution structure, wherein the connector is configured to be electrically connected to the first redistribution structure, and the encapsulated first die comprises an ASIC die.

19. The manufacturing method of the semiconductor package as claimed in claim 16, further comprising:
providing a heat dissipation member on a back surface of the first wafer after the first carrier is removed.

20. The manufacturing method of the semiconductor package as claimed in claim 16, further comprising:
mounting the second wafer onto a second frame carrier before the second carrier is removed, wherein the second redistribution structure facing the second frame carrier;
providing a heat dissipation member on a back surface of the second wafer after the second carrier is removed; and
removing the second frame carrier.

* * * * *